United States Patent [19]

Shimoda et al.

[11] 4,389,967
[45] Jun. 28, 1983

[54] BOAT FOR CARRYING SEMICONDUCTOR SUBSTRATES

[75] Inventors: Haruo Shimoda, Tama; Kaoru Tanabe, Kawasaki, both of Japan

[73] Assignee: Fujitsu Limited, Kawasaki, Japan

[21] Appl. No.: 227,075

[22] PCT Filed: May 9, 1980

[86] PCT No.: PCT/JP80/00099

§ 371 Date: Jan. 11, 1981

§ 102(e) Date: Dec. 31, 1980

[87] PCT Pub. No.: WO80/02622

PCT Pub. Date: Nov. 27, 1980

[30] Foreign Application Priority Data

May 11, 1979 [JP] Japan .............................. 54-62674

[51] Int. Cl.³ ........................................... B61B 13/00
[52] U.S. Cl. .................................... 118/500; 118/729; 432/241; 432/246; 104/138 R; 105/365

[58] Field of Search ............... 432/241, 246; 118/729, 118/500, 728, 503; 427/94, 255.5; 105/365; 104/138 R

[56] References Cited

U.S. PATENT DOCUMENTS

| | | | |
|---|---|---|---|
| 3,640,398 | 2/1972 | Loxley et al. | 118/500 X |
| 3,705,714 | 12/1972 | Alliegro | 432/241 |
| 3,746,569 | 7/1973 | Pammer et al. | 427/237 |
| 4,089,735 | 5/1978 | Sussmann | 156/612 |
| 4,089,992 | 5/1978 | Doo et al. | 427/94 |

Primary Examiner—John D. Smith
Assistant Examiner—Bernard F. Plantz
Attorney, Agent, or Firm—Staas & Halsey

[57] ABSTRACT

In a boat with wheels for carrying semiconductor substrates, the friction surfaces of the wheel systems are coated with a silicon nitride film to prevent seizure from occurring during a diffusion, oxidation or annealing process for semiconductor substrates.

8 Claims, 7 Drawing Figures

BOAT FOR CARRYING SEMICONDUCTOR SUBSTRATES

BACKGROUND OF THE INVENTION

The present invention relates to a boat for carrying semiconductor substrates, which boat is used in an impurity-diffusion process, an oxidation process or an annealing process.

Recently, the size of a semiconductor substrate, for example, a silicon wafer used for producing semiconductor devices, e.g., ICs and LSIs, has become larger than 2 inches in diameter. When a large number of the semiconductor substrates are subjected to a diffusion or oxidation process, the total weight of a boat, which is made of quartz and carries a large number of the large size semiconductor substrates, is heavy. When the heavy boat is put in and out of a quartz tube of a diffusion furnace or an oxidation furnace, finely powdered quartz is generated by friction between the quartz boat and the quartz tube. In the case of a boat made of polycrystalline silicon instead of the quartz, finely powdered quartz and polycrystalline silicon are generated by friction between the polycrystalline silicon boat and the quartz tube. In order to reduce the generation of fine powder to as small an amount as possible, the boat is provided with wheels made of the same material as that of the boat, so as to reduce the friction.

However, since axles and bearings (e.g. plates with through-holes) for the wheels of the above-mentioned quartz boat are made of quartz, the axles seize with the bearings so that the wheels cannot turn, when the quartz boat is heated at temperatures above 1000° C. during the diffusion or oxidation process. Moreover, the quartz wheels seize with the quartz tube. In order to avoid such seizures, generally, the quartz boat is incessantly moved back and forth during the diffusion or oxidation process. However, the movement of the quartz boat causes the generation of the finely powdered quartz from friction surfaces, i.e., contacting surfaces between the axles and the bearings and between the wheels and the quartz tube. When the wheels, axles and bearings of the above-mentioned polycrystalline silicon boat are made of polycrystalline silicon, and the boat is used for heat-treatment in an oxidizing atmosphere such as oxygen or water vapor, the surfaces of the wheels, axles and bearings are converted into silicon dioxide and seizure occurs in the same manner as the above-mentioned case of the quartz boat.

SUMMARY OF THE INVENTION

An object of the present invention is to provide an improved boat with wheels for carrying semiconductor substrates, which boat does not seize at temperatures above 1000° C. during the diffusion, oxidation or annealing process for the semiconductor substrates.

The above-mentioned object is attained by an improved boat with wheels for carrying semiconductor substrates, in which the improvement comprises that the friction surfaces of the wheel systems are coated with a silicon nitride film.

The body, wheels, axles and bearings of the boat are made of quartz, e.g., fused quartz, or polycrystalline silicon. It is preferable to coat the surfaces of the axles and the bearings that contact with each other and the surfaces of the wheels that contact the quartz tube of a heating furnace with the silicon nitride film having a thickness of 300~600 nm by a conventional coating process, e.g., a chemical vapor deposition (CVD) process or a direct surface nitrification process.

DESCRIPTION OF THE PREFERRED EMBODIMENTS

Figure 1:
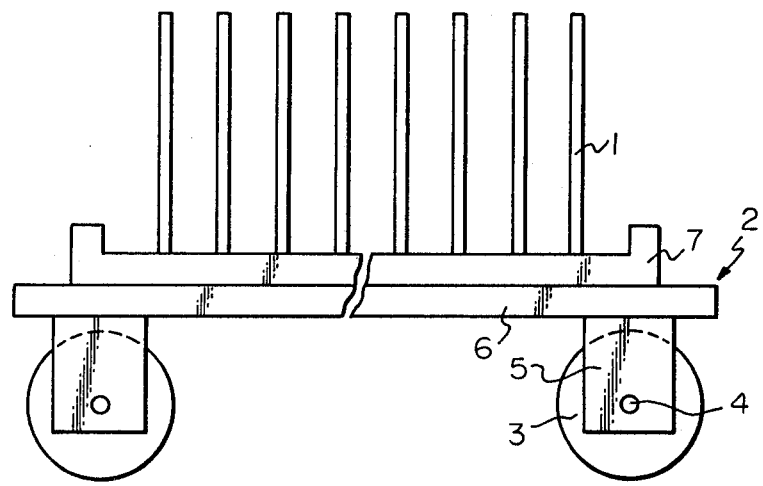
FIG. 1 is a schematic sectional view of a boat with wheels, which boat carries semiconductor substrates.

A boat 2 for carrying a large number of semiconductor substrates 1, as shown in FIG. 1, comprises wheels 3, axles 4, plates 5 for bearings, a carrying plate 6 and a holding plate 7 for semiconductor substrates. Those parts 3, 4, 5, 6 and 7 of the boat 2 are made of fused quartz. It is possible to directly put the semiconductor substrates 1 on the carrying plate 6. However, it is preferable to provide the holding plate 7, which can be attached and detached, on the carrying plate 6, as shown in FIG. 1.

Figure 2:
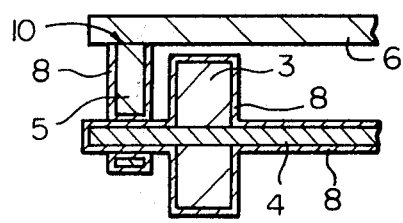
FIG. 2 is a segmental sectional view illustrating a wheel system of a boat with wheels according to the present invention.

In the above-mentioned boat 2, the wheel 3, axle 4 and plate 5 for a bearing which are coated with a silicon nitride film 8 according to the present invention, are illustrated in FIG. 2 of a segmental sectional view. Since the contacting surfaces of the axle 4 and a through hole which is provided in the plate 5 are coated with the silicon nitride film 8, the quartz of the axle 4 does not seize with that of the plate 5 for the bearing at elevated temperatures above 1000° C. Moreover, since the surface of the wheel 3 which contracts the inside surface of a quartz tube (not shown) of a conventional heating furnace (e.g. a diffusion, an oxidation or an annealing furnace) is also coated with the silicon nitride film 8, the wheel 3 does not seize with the quartz tube. The silicon nitride film is hard and is stable without melting at elevated temperatures above 1000° C. in a usual diffusion, oxidation or annealing process, for example, at a temperature of 1250° C. in an antimony (Sb) diffusion process.

The boat with wheels according to the present invention is produced in the following manner.

Figure 3A:
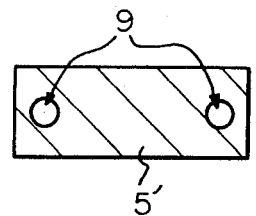
FIG. 3a is a schematic sectional view of a plate for the bearings for the wheel.
Figure 3B:
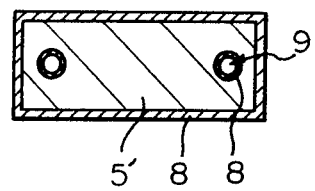
FIG. 3b is a schematic sectional view of the plate for the bearings, which plate is coated with a silicon nitride film.

Two through holes 9 for accommodating the axles 4 of the wheel 3 are formed in a fused quartz plate 5', as shown in FIG. 3a. The quartz plate 5' is inserted into a conventional chemical vapor deposition apparatus and then is coated with the silicon nitride film 8, as shown in FIG. 3b. A chemical vapor deposition of silicon nitride is carried out by using a mixed gas of ammonia ($NH_3$) and monosilane ($SiH_4$) in the ratio of 100:2, under a pressure of 3 Torr at a temperature of 850° C. for approximately 2 hours; thus, a silicon nitride film 8 having a thickness of approximately 300 nm is obtained. Then, the quartz plate 5' with the silicon nitride film 8 is bisected to obtain a plate 5 for the bearing having predetermined dimensions and an exposed quartz surface 10 at the cut portion, as shown in FIG. 3c.

Figure 3C:
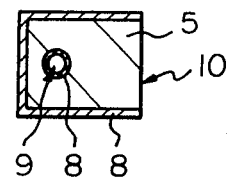
FIG. 3c is a schematic sectional view of the bisected plate of FIG. 3b.
Figure 3D:
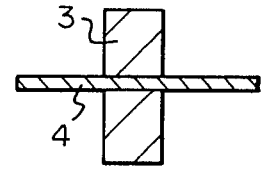
FIG. 3d is a schematic sectional view of a wheel and an axle.
Figure 3E:
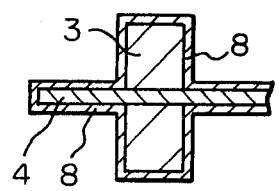
FIG. 3e is a schematic sectional view of the wheel and the axle coated with a silicon nitride film.

Since the wheel 3 and axle 4 are made of fused quartz, the wheel 3 and axle 4 are joined by fusing, as shown in FIG. 3d. The joined wheel 3 and axle 4 are inserted into the above-mentioned chemical vapor deposition apparatus and then are coated with the silicon nitride film 8 under chemical vapor deposition conditions, which are the same as the above-mentioned conditions, as shown in FIG. 3e.

The axle 4 coated with the silicon nitride film 8 is put in the through hole 9 of the plate 5 of FIG. 3c. Then, the plate 5 with the axle 4 is fixed to the carrying quartz plate 6 by fusing the exposed quartz surface 10 of the plate 5 with the carrying plate 6, as shown in FIG. 2.

If a boat is to be made of polycrystalline silicon instead of quartz, since it is difficult to join polycrystalline silicon parts of the boat by fusing, the boat is produced by assembling the polycrystalline silicon parts without fusing. In this case, friction surfaces of the wheel system, namely, wheels, axles and bearings which contact each other and other contacting surfaces which contact the quartz tube of the heating furnace, are coated with a silicon nitride film by the above-mentioned chemical vapor deposition process.

It will be obvious that the present invention is not restricted to the above-described embodiment and that many variations are possible for those skilled in the art without departing from the scope of the present invention.

The boat for carrying semiconductor substrates according to the present invention can be repeatedly used in the diffusion, oxidation or annealing process for semiconductor substrates, since seizure does not occur at elevated temperatures above 1000° C. Moreover, the amount of fine powder generated by the boat with wheels of the present invention is smaller than that generated by a conventional boat with wheels.

We claim:

1. A boat for carrying semiconductor substrates, comprising:
    holding means for holding the semiconductor substrates thereon;
    an axle;
    bearing means for bearing the axle, said bearing means being fixed to said holding means and including a bearing portion through which said axle rotatably extends;
    a wheel fixed to said axle; and
    a silicon nitride film formed on the surface of at least one of said axle and said bearing portion,
    wherein the holding means, wheel, axle and bearing means of said boat are made from the group consisting of quartz and polycrystalline silicon.

2. A boat according to claim 1, wherein the surfaces of said axle and of said bearing portion accommodating said axle are both coated with a silicon nitride film.

3. A boat according to claim 1, wherein the surfaces of said wheel which contact the quartz tube of a heating furnace are coated with a silicon nitride film.

4. A system for carrying semiconductor substrates during high-temperature processing in a tube, comprising:
    a support;
    a plurality of wheels;
    means mounting the wheels for rolling the support within the tube, said means being made substantially from the group consisting of quartz and polycrystalline silicon; and
    silicon nitride separating the sliding surfaces within the means mounting the wheels.

5. The system of claim 4, wherein there are at least a pair of wheels, and wherein the means mounting the wheels comprises a pair of bearing plates attached to the support at spaced-apart positions, each bearing plate having an opening, and an axle rotatably extending through the openings in the pair of bearing plates, said at least one pair of wheels being affixed to the axle.

6. The system of claim 5, wherein the silicon nitride separating the sliding surfaces comprises a film of silicon nitride coating the openings in the bearing plates and a film of silicon nitride coating the axle.

7. The system of claim 6, further comprising a film of silicon nitride coating the wheels.

8. The system of claim 7, wherein the bearing plates are fused to the support and the wheels are fused to the axle.

* * * * *

UNITED STATES PATENT AND TRADEMARK OFFICE
CERTIFICATE OF CORRECTION

PATENT NO. : 4,389,967
DATED : June 28, 1983
INVENTOR(S) : Shimoda et al.

It is certified that error appears in the above-identified patent and that said Letters Patent is hereby corrected as shown below:

Col. 1, line 65, delete "with".

Col. 2, line 18, after "axle" change "," to --;--;
line 39, "through" should be --through- --.

Signed and Sealed this

Twelfth Day of February 1985

[SEAL]

Attest:

DONALD J. QUIGG

*Attesting Officer*   *Acting Commissioner of Patents and Trademarks*